United States Patent
Scholzen et al.

(10) Patent No.: US 9,326,408 B2
(45) Date of Patent: Apr. 26, 2016

(54) SENSOR HAVING A SENSOR HOUSING

(75) Inventors: Holger Scholzen, Stuttgart (DE); Christoph Gmelin, Stuttgart (DE); Jens Vollert, Muehlhausen (DE); Markus Ellmer, Eisenach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 826 days.

(21) Appl. No.: 13/512,753

(22) PCT Filed: Oct. 7, 2010

(86) PCT No.: PCT/EP2010/065029
§ 371 (c)(1),
(2), (4) Date: Aug. 10, 2012

(87) PCT Pub. No.: WO2011/067022
PCT Pub. Date: Jun. 9, 2011

(65) Prior Publication Data
US 2012/0320555 A1   Dec. 20, 2012

(30) Foreign Application Priority Data

Dec. 4, 2009   (DE) .......................... 10 2009 047 506

(51) Int. Cl.
| | |
|---|---|
| *H05K 7/02* | (2006.01) |
| *H05K 7/04* | (2006.01) |
| *H02B 1/00* | (2006.01) |
| *H02B 1/56* | (2006.01) |

(Continued)

(52) U.S. Cl.
CPC *H05K 7/02* (2013.01); *G01L 19/14* (2013.01); *G01L 19/148* (2013.01); *H05K 13/00* (2013.01); *H01L 2224/48091* (2013.01); *H01L 2224/48228* (2013.01); *H01L 2224/48472* (2013.01); *H01L 2224/49175* (2013.01); *Y10T 29/49002* (2015.01)

(58) Field of Classification Search
CPC . G01L 19/0038; G01L 19/143; G01L 19/148; H01L 23/06; H01L 23/48; H05K 7/02; H05K 13/00
USPC .................. 361/678, 687, 690, 700, 807–812; 257/684, 690; 29/592.1; 438/110–112, 438/118
See application file for complete search history.

(56) References Cited

U.S. PATENT DOCUMENTS

| | | | |
|---|---|---|---|
| 6,615,669 B1 * | 9/2003 | Nishimura | G01L 19/0038 73/706 |
| 6,993,976 B2 | 2/2006 | Fessele et al. | |

(Continued)

FOREIGN PATENT DOCUMENTS

| | | |
|---|---|---|
| DE | 199 61 776 | 12/2000 |
| DE | 19961776 A1 | 12/2000 |

(Continued)

OTHER PUBLICATIONS

International Search Report for PCT/EP2010/065029, dated Feb. 22, 2011.

*Primary Examiner* — Courtney Smith
*Assistant Examiner* — Zhengfu Feng

(57) ABSTRACT

A sensor has a sensor housing, an electronic component, and a sensor element. The electronic component and the sensor element are connected to one another in a media-tight manner. An adhesive which provides a seal is placed between bonding sites of a bonding wire of the at least one electrical connection.

8 Claims, 2 Drawing Sheets

(51) Int. Cl.
*H05K 7/20* (2006.01)
*H01S 4/00* (2006.01)
*H01L 21/00* (2006.01)
*H05K 13/00* (2006.01)
*G01L 19/14* (2006.01)

(56) References Cited

U.S. PATENT DOCUMENTS

2003/0057541 A1* 3/2003 Betori ............................ 257/690
2003/0122137 A1* 7/2003 Hashimoto ..................... 257/80

FOREIGN PATENT DOCUMENTS

| | | | | |
|---|---|---|---|---|
| DE | 102 23 357 | 12/2003 | | |
| JP | 61-253437 | 11/1986 | | |
| JP | 61253437 A | * 11/1986 | | |
| JP | 1-280232 | 11/1989 | | |
| JP | 05-029798 | 2/1993 | | |
| JP | 5-136309 | 6/1993 | | |
| JP | 05136309 A | * 6/1993 | ............. | G01L 19/00 |
| JP | 6-87840 | 12/1994 | | |
| JP | 9-26371 | 1/1997 | | |
| JP | 09-26371 | 1/1997 | | |
| JP | 10-197381 | 7/1998 | | |
| JP | 11-326087 | 11/1999 | | |
| JP | 11326087 A | * 11/1999 | ............. | C09J 183/08 |
| JP | 2000-337987 | 12/2000 | | |
| JP | 2001-311672 | 11/2001 | | |
| JP | 2002-372473 | 12/2002 | | |
| RU | 2191358 C2 | 10/2002 | | |
| RU | 2330252 C2 | 7/2008 | | |
| WO | WO 03/100371 | 12/2003 | | |

* cited by examiner

SENSOR HAVING A SENSOR HOUSING

BACKGROUND OF THE INVENTION

1. Field of the Invention

The present invention relates to a sensor having a sensor housing.

2. Description of the Related Art

Published German patent application document DE 102 23 357 A1 relates to a pressure measurement device. The pressure measurement device includes a housing in which a substrate provided with a sensor element and electrical connecting elements is situated. The housing has a first housing chamber which encloses the sensor element and is connected to a first pressure channel of a first pressure connection, and a second housing chamber which is sealed with respect to the first housing chamber and which encloses at least the electrical connecting elements. The housing has a third housing chamber which is sealed with respect to the first housing chamber and the second housing chamber, and which is connected to a second pressure channel of a second pressure connection.

Current developments for pressure sensors pursue a design concept referred to by the term chip-in-housing (CiH). According to this design concept, the sensor chips are glued directly into the sensor housing made of plastic. If two chips, for example a sensor element and a separate electronic component, for example an ASIC, are used, it is necessary to establish multiple electrical connections between the sensor element and the electronic component such as the above-mentioned ASIC, for example. In order to reduce, and in the ideal case totally avoid, the media load to which the electronic component is exposed, the design concept provides that the electronic component and the sensor element are situated in separate chambers. The separation between the two chambers must be designed to be media-tight against exhaust gas, moisture, and other media. According to current approaches, a leadframe injected into the housing of the pressure sensor is used, and gluing, in particular bonding, is carried out on both sides of the leadframe. This technique requires a tightly sealed extrusion coating of a conductor comb, i.e., the leadframe, to avoid penetration of moisture, for example. However, the required media seal-tightness of insert parts is generally not achieved. In addition, a gold or gold-plated surface of the conductor comb may be attacked due to the bonding process, which promotes the formation of corrosion. According to current approaches, the chamber in which the sensor element is accommodated is filled with a gel as additional protection.

For sensors which are in serial production nowadays, in particular pressure sensors which are used in low-pressure areas, the electronic component (ASIC) and the sensor element are also located inside the same housing region, i.e., inside the same chamber. It is also customary for the sensor element and the electronic component, i.e., the ASIC, to be provided within the same silicon chip. An important requirement for new generations of sensors, in particular pressure sensors, is that they must be much more resistant to exhaust gas than preceding sensor generations. It has been shown that the exhaust gas resistance of the sensor element is easier to ensure than the exhaust gas resistance of the electronic component, for example an ASIC. This, in addition to the need for variant management with regard to a flexible assortment of customer-specific forms of sensor elements, likewise having variable ASIC designs, is the reason that the electronic component, in particular an ASIC, and the sensor must be separate from one another.

Thus, the sensor element is located in a chamber which is exposed to the medium, in particular the exhaust gas, while the electronic component, i.e., the ASIC, is located in a separate chamber which is kept from exposure to the media influence.

For low-pressure sensors, two silicon chips are used. One of the two chips is used as a sensor element, while the other is used as an electronic component, for example an ASIC.

An important requirement for this new pressure sensor development is that it must be much more resistant to exhaust gas than preceding generations of pressure sensors. It is generally easier to ensure the exhaust gas resistance of a sensor element compared to ensuring the exhaust gas resistance of an electronic component such as an ASIC. This, in addition to the need for variant management while taking into account customer-specific forms of sensor elements, likewise having variable ASIC designs, is the reason that a sensor element and an electronic component, for example an ASIC, are kept separate from one another.

BRIEF SUMMARY OF THE INVENTION

According to the proposed approach according to the present invention, an electronic component, for example an ASIC or a sensor element, is mounted in a base plate of a sensor housing, which in particular is made of plastic. The electronic component and the sensor element are preferably glued onto an upper plane surface of the base plate which is exposed to the medium. An electrical connection such as a printed conductor, for example, is situated approximately in the middle between the sensor element and the electronic component, for example an ASIC, situated at a distance therefrom. This electrical connection, which is used as a printed conductor, is preferably provided using MID technology, and may, for example, be provided by metal plating which includes a gold layer which covers a base layer such as a nickel underlayer, for example. The metal platings produced with the aid of MID technology are preferably introduced into depressions in the plane surface of the base plate of the sensor housing. In molded interconnect device (MID) technology, conductive patterns in the form of a structured metal layer are applied to three-dimensional injection-molded circuit substrates. Within the scope of MID technology, mechanical and electrical functions are combined in the component; in addition, the housing function and circuit substrate function are combined, and the mechanical connecting and fixing elements and snap-fit hooks are integrated. This results in a significant reduction in the material use and the number of individual parts. Furthermore, the installation effort for the various components may be greatly reduced, and the process chain may be shortened.

The individual depressions for the individual strip-shaped metal platings are separated from one another by webs of the plastic material of the base plate. The metal platings may also be embedded in depressions with respect to the plane surface of the base plate by hot stamping, sounding, or extrusion coating of the plastic material.

The metal platings which are used as a printed conductor are preferably introduced into depressions with respect to the upper plane surface of the base plate in such a way that the depressions have a width that exceeds the strip width of the metal platings, which preferably are produced using MID technology.

A bond connection which includes a bonding wire is established between the sensor element and the metal plating which functions as a printed conductor. One bonding site is located on the sensor element, and another bonding site is located at one end of the further metal plating used as a printed conductor. The respective other end of the metal platings used as a printed conductor has a bonding site from which a further bonding wire extends to the electronic component, for example an ASIC. There is a sufficient distance between the two bonding sites at the two opposite ends of the metal platings which function as a printed conductor that an adhesive material, preferably designed as an adhesive bead, may be placed at this location in an operationally reliable manner, and does not contact the bonding sites situated at the ends of the metal platings used as a printed conductor. The adhesive material in the form of an adhesive bead may be provided before or after the bond connections are established between the ends of the metal plating used as a printed conductor and the bonding wires to the electronic component or to the sensor element.

The adhesive material which is applied in the form of an adhesive bead to the metal plating used as a printed conductor is placed between the two bonding sites in such a way that it is reliably ensured that the bonding sites do not contact one another. Consequently, the bonding sites are not subjected to mechanical load, which results in a very robust design of an electrical connection.

The proposed approach according to the present invention takes into account the fact that if the connection between the metal plating used as a printed conductor and the base plate made of plastic material is impaired, a medium is able to penetrate, so that a seal is no longer present between the sensor element on the one side and the electronic component, for example an ASIC, on the other side. To take this fact into account, the metal plating used as a printed conductor is applied inside the depressions in the base plate with a slight elevation so that the adhesive material, which in particular is applied as an adhesive bead, laterally seals between the ends of the metal platings used as a printed conductor, which also results in a lateral seal in each case between the metal platings used as a printed conductor and the material of the base plate. To additionally secure the bonding sites at the ends of the metal plating used as a printed conductor as well as the bonding wires themselves, a gel may be applied on the side of the base plate, preferably made of plastic material, which is acted on by the medium, the gel covering the individual bonding wires as well as the bonding sites.

The adhesive material, preferably in the form of an adhesive bead, which is applied to the metal platings used as a printed conductor is media-tight, and also seals off the base plate and cover plate upon joining, so that no medium flows from the chamber for accommodating the sensor element, formed when the cover element and the base plate are joined, into the chamber in which the electronic component, for example an ASIC, is accommodated. The flexibility of the adhesive material of the adhesive bead compensates for dimensional and installation tolerances in a particularly advantageous way.

A sealing blade is preferably situated on the bottom side of the cover element to be mounted on the base plate, the sealing blade being submerged into accumulations of adhesive material preferably formed as an adhesive bead, ultimately providing the media-tight seal between the chamber in which the sensor element is accommodated and the chamber in which the electronic component (ASIC) is accommodated. When the cover element is installed, the sealing blade on the bottom side of the cover element moves into the still soft, deformable material of the adhesive and deforms same, pressing it in particular into the free spaces between the metal platings used as a printed conductor and the webs of the material of the base plate, thus forming a media-tight seal. The dimensions of the sealing blade on the bottom side of the cover element are preferably selected in such a way that the sealing blade penetrates far enough into the adhesive bead that the material of the adhesive of the adhesive bead is deformed to the greatest extent possible, and a seal may be achieved between the two chambers inside the sensor housing.

A particularly simple and short electrical connection is established between a sensor element and an electronic component, for example an ASIC, as a result of the proposed approach according to the present invention. The simple, short electrical connection offers advantages with regard to electromagnetic compatibility, space requirements, and costs. In addition, with the aid of the proposed approach according to the present invention for media-tight connections between electronic components and the sensor element, a high level of exhaust gas resistance of the overall sensor thus formed may be achieved. Furthermore, a mechanically robust design is advantageously provided by at least two bond connections which lead onto a metal plating which represents a printed conductor. The seal via the adhesive bead is achieved in particular outside the regions of the bonding sites, so that the bonding sites are not subjected to mechanical load.

DETAILED DESCRIPTION OF THE INVENTION

Figure 1:
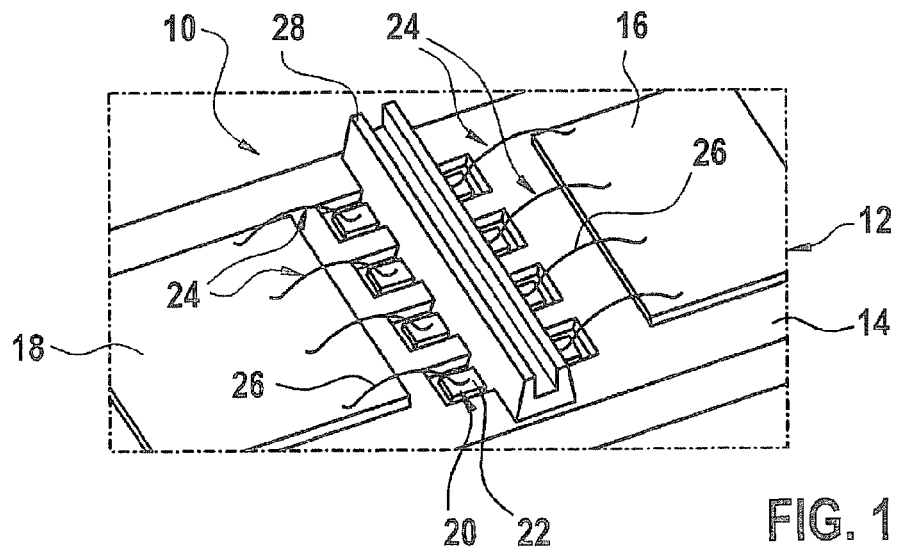
FIG. 1 shows an adhesive bead which covers the metal platings, used as a printed conductor, between the bonding sites.

FIG. 1 shows a base plate of a sensor housing which includes a sensor element and an electronic component, for example an ASIC.

A sensor 10, which is only schematically illustrated, is a low-pressure sensor, for example; an electronic component 16, for example an ASIC, as well as a sensor element 18 which is exposed to the medium, are situated on a shared base plate 14. Electronic component 16 and sensor element 18 are preferably glued onto a plane surface 60 of base plate 14 of sensor housing 12. As is apparent from the illustration according to FIG. 1, electronic component 16, which may be an ASIC, for example, and sensor element 18 are connected to one another via individual bonding wires 26. Bonding wires 24 contact the oppositely situated ends of a printed conductor 20, which may be provided by a metal plating 22, for example. A spacing is provided between the individual ends of metal platings 22, which are used as a printed conductor 20, and bonding wires 26, in the illustration according to FIG. 1 the spacing being covered by an adhesive bead 28 which centrally passes over individual metal platings 22 which function as a printed conductor 20. As illustrated in FIG. 1, adhesive bead 28 may have a groove which extends transversely with respect to the longitudinal extension of base plate 14, and into which a sealing blade 50 of a cover element 44 submerges, as described in greater detail below.

It is apparent from the illustration according to FIG. 1 that bonding wires 26 between sensor element 18, and bonding wires 26 between electronic component 16, contact the respective opposite ends of metal plating 22 which functions as a printed conductor 20.

Figure 2:
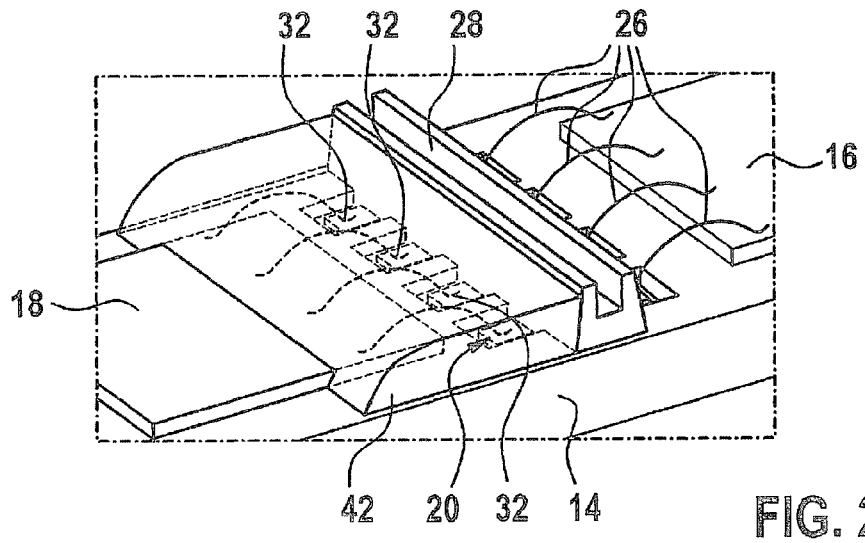
FIG. 2 shows a gel which partially covers the metal plating.

FIG. 2 shows that first bonding site 32 at one end of metal platings 22 used as a printed conductor, as well as bonding wires 26 which extend toward sensor element 18, may be covered by a gel 42. With the aid of gel 42, bonding wires 26 as well as first bonding site 32 on side 40 of base plate 40 acted on by the medium are protected from the medium to which sensor element 18 is exposed.

Base plate 14 of sensor housing 12 is preferably made of a plastic material such as polyphenylene sulfide (PPS), a thermoplastic, or polyphthalic amide (PPA), likewise a thermoplastic. The plastic injection molding process is particularly suited as a production method.

Figure 3:
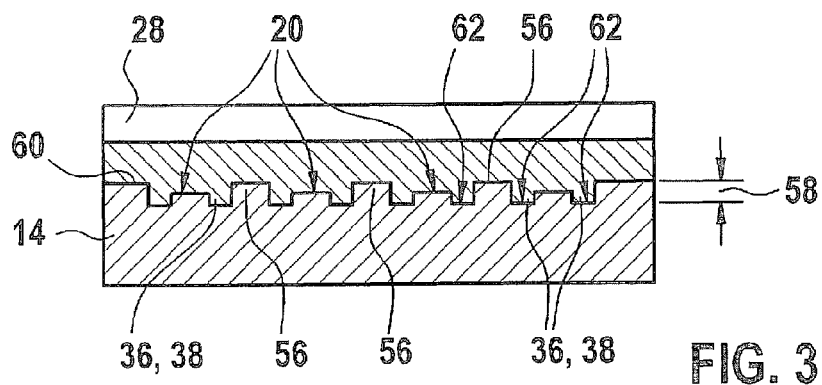
FIG. 3 shows a cross section of the base plate which has depressions for accommodating the metal platings used as a printed conductor, the depressions in each case being separated from one another by webs of the material of the base plate.

FIG. 3 shows a section of the base plate in the region of the adhesive material, which is preferably applied as an adhesive bead.

As is apparent from FIG. 3, base plate 14 has free spaces 36 in the region that is covered by adhesive bead 28 of the adhesive material. Free spaces 36 are separated from one another by webs 56 of the material of base plate 14. A web height of material webs 56 of the material of base plate 14 is denoted by reference numeral 58.

Pedestal-like protrusions on which, for example, metal platings 22 which function as a printed conductor 20 may be mounted are located in individual free spaces 36. Metal platings 22 which are used as a printed conductor 20 may be applied, for example, by hot stamping, sounding, or extrusion coating of the plastic material. Metal platings 22 are preferably produced using MID technology, and have a layer structure which may include an Au layer, for example, on the top side, and which is applied to a nickel layer.

According to the illustrations in FIGS. 1 and 2, adhesive bead 28 of the adhesive material extends between the ends of individual metal platings 22 which are used as a printed conductor 20.

During application of the adhesive material in the form of an adhesive bead 28, the material of adhesive bead 22 flows into free spaces 36, so that metal platings 22 which are used as a printed conductor 20 are also enclosed laterally, i.e., at their flanks (see reference numeral 38), by adhesive material of adhesive bead 28, resulting in a media-tight connection 62 which is formed by the flowing adhesive material of adhesive bead 28. The seal between a region of sensor housing 12 in which sensor element 18 is accommodated, and the remaining region of sensor housing 12 in which electronic component 16, designed as an ASIC, is located results in this way.

Figure 4:
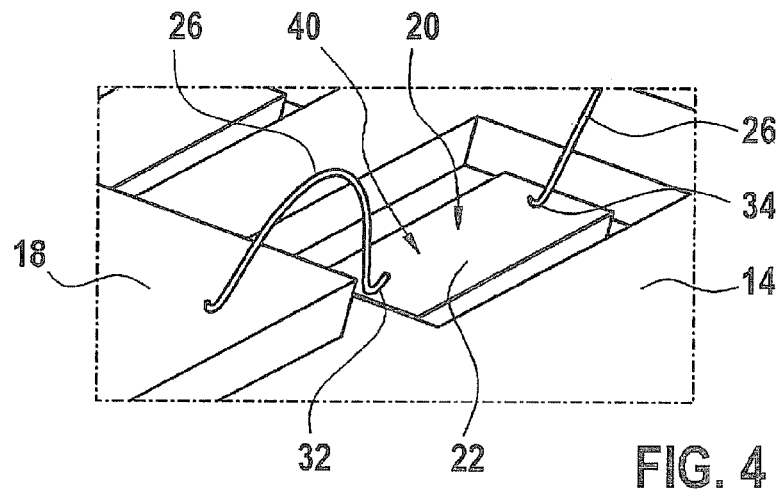
FIG. 4 shows the illustration of a metal plating in enlarged scale.

The illustration according to FIG. 4 shows a metal plating which is used as a printed conductor, in enlarged scale.

As is apparent from the illustration according to FIG. 4, bonding wire 26 extends from sensor element 18, which is exposed to the medium, to one end of metal plating 22 which functions as a printed conductor 20, and at this end at a first bonding site 32 is electrically contacted by metal plating 22 which is used as a printed conductor 20.

Situated at the opposite end of metal plating 22 which is used as a printed conductor 20 is a second bonding site 34, from which a further bonding wire 26 extends to electronic component 16, for example an ASIC (not illustrated in FIG. 4). It is apparent from the illustration according to FIG. 4 that the distance between bonding sites 32 and 34 between bonding wires 26 and metal plating 22 used as a printed conductor is great enough that sufficient space remains between bonding sites 32 and 34 for applying adhesive bead 28.

The side of base plate 14 of sensor housing 12 which is exposed to the medium is denoted by reference numeral 40.

Figure 5:
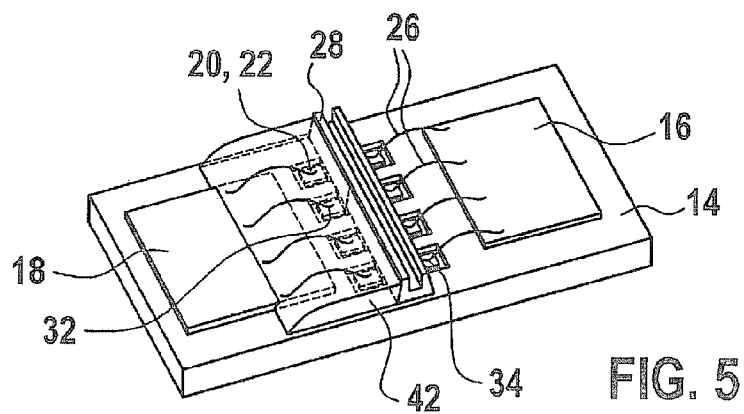
FIG. 5 shows an overall illustration of the base plate.

FIG. 5 shows an overall illustration of base plate 14 which on the one hand accommodates electronic component 16 and on the other hand accommodates sensor element 18. Individual bonding wires 26 which connect electronic component 16 to sensor element 18 are covered by adhesive bead 28, as are bonding sites 32, 34 which are located on metal plating 22 of printed conductors 20 which are embedded in depressions on the top side of base plate 14. Reference numeral 42 denotes a gel which covers half of bonding wires 26 extending from second bonding sites 32 to sensor element 18.

Figure 6:
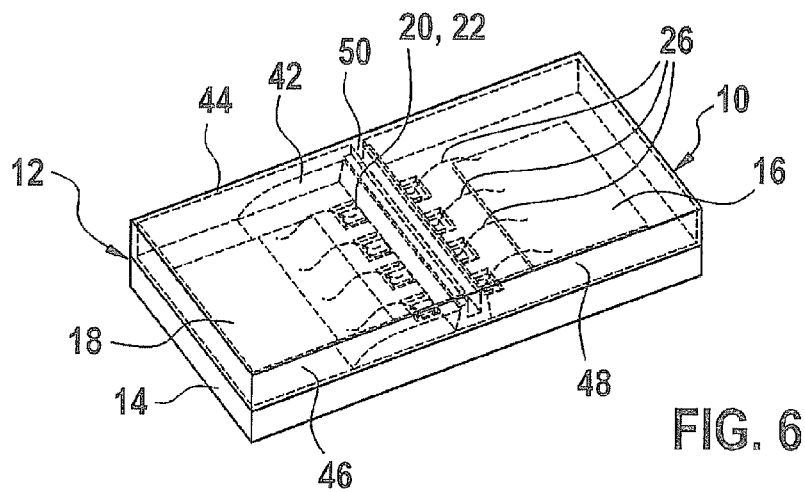
FIG. 6 shows the installed sensor housing together with a cover element which is mounted on the base plate and which covers the gel and the adhesive bead.

FIG. 6 shows the sensor housing with the cover element joined to base plate 14.

It is apparent from the illustration according to FIG. 6 that in the state in which a cover element 44 is joined to base plate 14, a sealing blade 50 is submerged into the plastically deformable material of adhesive bead 28 of the adhesive material. When the sealing blade submerges at the bottom side of cover element 44, the material of adhesive bead 28 is deformed in such a way that it flows and penetrates into free spaces 36, 38 (see the illustration according to FIG. 3), resulting in a media-tight connection 62 beneath adhesive bead 28. At the center of plane surface 60 of base plate 14, this media-tight connection forms a chamber 46 in which sensor element 18 is accommodated separately from a further chamber 48 in which electronic component 16, designed as an ASIC, for example, is located. As illustrated in FIG. 3, media-tight connection 62 is formed in that the elastically deformable material fills next to metal platings 22, used as a printed conductor 20, when sealing blade 50 submerges into adhesive bead 28 and free spaces 36.

Thus, beneath adhesive bead 28 no medium is able to flow from chamber 44, in which sensor element 18 is accommodated, into chamber 48 in which electronic component 16 is situated.

On the other hand, in order to establish an electrical connection which is robust and which also may be protected, as the result of penetration of gel 42, from the medium to be sensed.

Optionally, as indicated in the illustration according to FIG. 6, bonding wires 26 as well as first bonding sites 32, situated inside chamber 46 in which sensor element 18 is accommodated, may be protected by a gel 42. As a result of media-tight connection 62 according to the illustration in FIG. 3, the medium is prevented from flowing into chamber 48 in which more sensitive electronic component 16 is situated. Due to the elasticity of the adhesive material of adhesive bead 28, which extends essentially transversely with respect to the longitudinal extension of base plate 14 of sensor housing 12, dimensional and installation tolerances of sensor housing 12 of sensor 10 are also compensated for. Sealing blade 50 on the bottom side of cover element 44 is preferably dimensioned in such a way that the sealing blade penetrates far enough into the adhesive material of adhesive bead 28 that optimal flow of the elastically deformable adhesive material of adhesive bead 28 is achieved.

As a result of the proposed approach according to the present invention as described above with reference to FIGS. 1 through 6, a simple, short electrical connection 24 is achieved between sensor element 18 and electronic component 16. The shortness of the electrical connection offers advantages with regard to electromagnetic compatibility, as well as the required space with regard to manufacturing costs. With the aid of the proposed approach according to the present invention, a media-tight connection 62 is achieved inside a sensor housing 12 which supports the chip-in-housing (CiH) concept, since during establishment of the electrical connection, a seal may be achieved between, on the one hand, chamber 46 for accommodating sensor element 18 which is exposed to the medium, and on the other hand chamber 48 in which much more sensitive electronic component 16 is accommodated. An increased exhaust gas resistance of sensor 10 with respect to the medium, in particular the exhaust gas, is thus provided. Lastly, the proposed approach according to the present invention is characterized by its mechanically robust design as the result of only two bond connections to bonding sites 32 and 34 which are guided onto a metal plating 22 which is used as a printed conductor 20. In addition, the seal via the adhesive material of adhesive bead 28 is achieved outside the regions where bonding sites 32, 34 are situated, namely, at the ends of strip-shaped metal platings 22 which function as a printed conductor 20.

What is claimed is:

1. A sensor, comprising:
   a sensor housing;
   an electronic component; and
   a sensor element, wherein the electronic component and the sensor element are electrically connected to one another in a media-tight manner via an electrically-conductive plating and first and second bonding wires, the plating including first and second bonding sites, the first bonding wire connecting the first bonding site to the sensor element, the second bonding wire connecting the second bonding site to the electronic component, wherein an adhesive which provides a seal is placed between the first and second bonding sites and between the first and second bonding wires, and wherein the adhesive is placed on the plating, and wherein a gel is applied on a media side of a base plate, the gel at least partially covering the first bonding sites and the first bonding wires.

2. The sensor as recited in claim 1, wherein the plating is (i) implemented with molded-interconnect-device technology and (ii) embedded in a base plate of the sensor housing.

3. The sensor as recited in claim 2, wherein the plating has at least one of a gold layer and a nickel underlayer.

4. The sensor as recited in claim 1, wherein the plating includes a printed conductor which is one of (i) hot-stamped into a base plate of the sensor housing, (ii) sounded into the base plate of the sensor housing, or (iii) extrusion-coated by a plastic material of the base plate.

5. The sensor as recited in claim 2, wherein the plating is embedded in the base plate between webs.

6. The sensor as recited in claim 1, wherein the adhesive forms a media-tight connection between the plating in a base plate and a cover element of the sensor housing, the media-tight connection separating the sensor element from a further chamber in which the electronic component is accommodated.

7. The sensor as recited in claim 1, wherein the plating is introduced into a base plate, and wherein the plating is introduced between webs formed by a material of the base plate, in such a way that in addition to the plating and the webs, free spaces are formed in the base plate, and the free spaces are at least partially filled with a material of the adhesive.

8. A sensor, comprising:
   a sensor housing;
   an electronic component and
   a sensor element, wherein the electronic component and the sensor element are electrically connected to one another in a media-tight manner via an electrically-conductive plating and first and second bonding wires, the plating including first and second bonding sites, the first bonding wire connecting the first bonding site to the sensor element, the second bonding wire connecting the second bonding site to the electronic component, wherein an adhesive which provides a seal is placed between the first and second bonding sites and between the first and second bonding wires, and wherein the adhesive is placed on the plating, wherein the plating is (i) implemented with molded-interconnect-device technology and (ii) embedded in a base plate of the sensor housing, and wherein:
   the plating is used as a printed conductor;
   free spaces are formed next to the plating; and
   the free spaces are filled by a filler material with the aid of the adhesive.

* * * * *